(12) United States Patent
Chen et al.

(10) Patent No.: US 8,624,324 B1
(45) Date of Patent: Jan. 7, 2014

(54) CONNECTING THROUGH VIAS TO DEVICES

(75) Inventors: Ming-Fa Chen, Taichung (TW); Yu-Young Wang, New Taipei (TW); Sen-Bor Jan, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/572,337

(22) Filed: Aug. 10, 2012

(51) Int. Cl.
*H01L 29/423* (2006.01)
*H01L 21/28* (2006.01)

(52) U.S. Cl.
USPC .... 257/368; 257/288; 257/412; 257/E29.116; 257/E29.128; 257/E21.177; 257/E21.182; 438/151; 438/197

(58) Field of Classification Search
USPC .......... 257/288, 368, 412, E29.128, E29.116, 257/E21.182, E21.177; 438/151, 197
See application file for complete search history.

(56) References Cited

U.S. PATENT DOCUMENTS

| 7,868,425 | B2 * | 1/2011 | Kondo et al. | 257/616 |
| 2005/0173738 | A1 * | 8/2005 | Kondo et al. | 257/262 |
| 2005/0239241 | A1 * | 10/2005 | Ouyang et al. | 438/197 |
| 2009/0108363 | A1 * | 4/2009 | Forbes et al. | 257/368 |
| 2011/0018032 | A1 * | 1/2011 | Kondo et al. | 257/192 |
| 2013/0017642 | A1 * | 1/2013 | Milgrew et al. | 438/49 |

* cited by examiner

*Primary Examiner* — Victor A Mandala
(74) *Attorney, Agent, or Firm* — Slater & Matsil, L.L.P.

(57) ABSTRACT

Methods and devices for connecting a through via and a terminal of a transistor formed of a strained silicon material are provided. The terminal, which can be a source or a drain of a NMOS or a PMOS transistor, is formed within a substrate. A first contact within a first inter-layer dielectric (ILD) layer over the substrate is formed over and connected to the terminal. A through via extends through the first ILD layer into the substrate. A second contact is formed over and connected to the first contact and the through via within a second ILD layer and a contact etch stop layer (CESL). The second ILD layer is over the CESL, and the CESL is over the first ILD layer, which are all below a first inter-metal dielectric (IMD) layer and the first metal layer of the transistor.

20 Claims, 5 Drawing Sheets

CONNECTING THROUGH VIAS TO DEVICES

This application relates to the following co-pending and commonly assigned patent application: Ser. No. 13/457,823, filed Apr. 27, 2012, entitled "Through-Substrate Vias and Methods for Forming the Same."

BACKGROUND

Since the invention of the integrated circuit (IC), the semiconductor industry has experienced rapid growth due to continuous improvements in the integration density of semiconductor devices (e.g., transistors, diodes, resistors, capacitors, etc.) and continuous reduction in the critical dimension (CD) of semiconductor devices. With the continuous reduction of the CD of semiconductor devices, the scale of the gate, source and drain of a transistor decreases accordingly, which results in the decrease of carriers that determine the magnitude of the current in the transistor.

In various techniques to improve the performance of transistors, one method is to apply mechanical stress to the channel of a transistor to increase the carrier mobility and to reduce resistance. Strained silicon transistors are a result of the application of such a method.

On the other hand, the integration improvements and reductions on CD of semiconductor devices are essentially two-dimensional (2D) in nature, in that the volume occupied by the integrated devices is essentially on the surface of the semiconductor wafer. Although dramatic improvements in lithography have resulted in considerable improvement in 2D IC formation, there are physical limits to the density that can be achieved in two dimensions.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies are then bonded to a carrier substrate and wire bonds electrically coupled contact pads on each die to contact pads on the carrier substrate.

In a 3D IC, the two dies may be bonded together on top of each other using various means such as through vias, e.g., through silicon vias (TSVs) or through-substrate vias. Generally, a through via is formed by etching a vertical via through a substrate and filling the via with a conductive material, such as copper.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure. Throughout the various views and illustrative embodiments, like reference numbers are used to designate like elements.

In the following description, embodiments are disclosed in the context of forming a connection between a through silicon via used in forming a three-dimensional integrated circuit (3D IC) and a terminal of a strained silicon transistor of a circuit. The connection is made by contacts formed in a first inter-layer dielectric (ILD) layer over a substrate, a contact etch stop layer (CESL) over the first ILD layer, and a second ILD layer over the CESL, which are all below a first inter-metal dielectric (IMD) layer and the first metal layer of the transistor.

Figure 1:
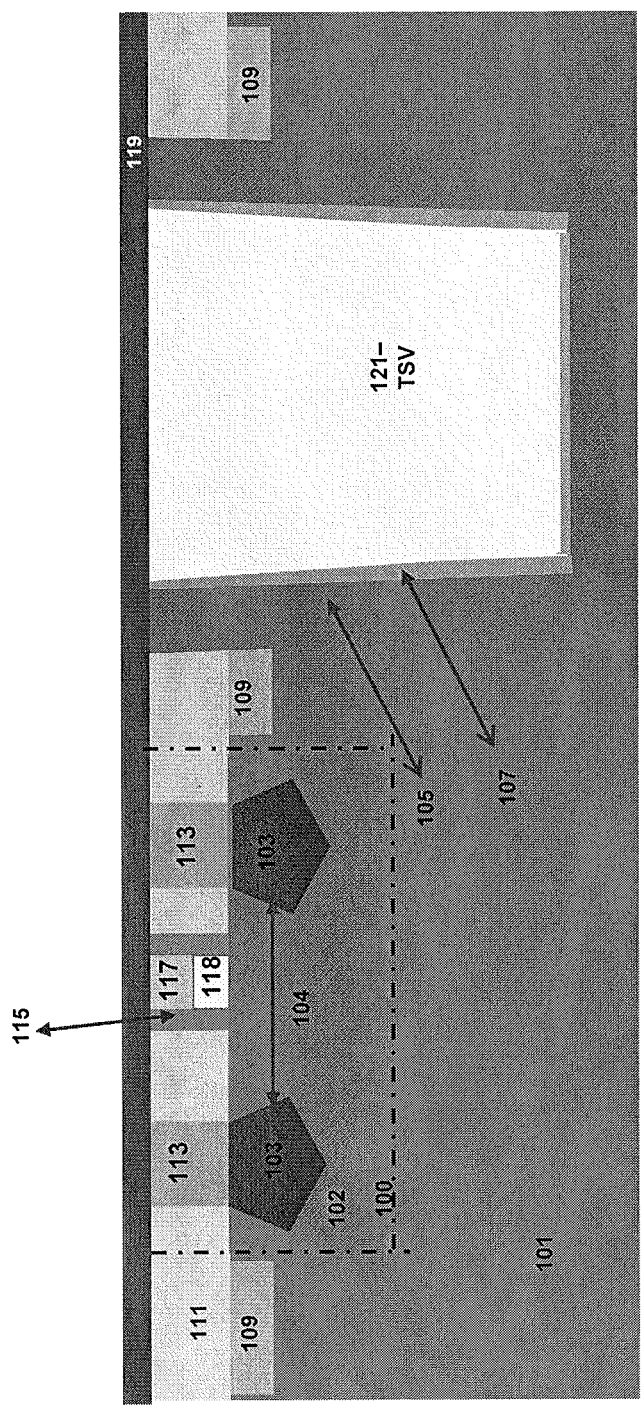
FIGS. 1-5 illustrate various intermediate stages of a process for forming a connection between a strained silicon transistor and a through via in accordance with an embodiment.

As illustrated in FIG. 1, a substrate 101 is provided. The substrate 101 may be a part of a circuit, a device, a die, or a wafer. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer, provided on a substrate, typically a silicon or glass substrate. Other substrates, such as a multi-layered or gradient substrate, or substrates comprising compound semiconductor substrates, e.g., gallium arsenide, or alloy semiconductor substrate, e.g., silicon-germanium, may also be used. The substrate 101 has a front side where a transistor 100 and other devices may be formed, and a backside opposite to the front side.

A plurality of shallow trench isolations (STIs) 109, or other isolation structures, may be formed in the substrate 101 to isolate device regions. The STIs 109 may be formed by etching substrate 101 using photolithography techniques to form recesses. Generally, photolithography involves depositing a photoresist material, which is then masked, exposed, and developed. After the photoresist mask is patterned, an etching process may be performed to remove unwanted portions of the substrate 101. In an embodiment in which the substrate 101 comprises bulk silicon, the etching process may be a wet or dry, anisotropic or isotropic, etch process. The recesses are then filled with a dielectric material such as an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. A planarization step may be performed to planarize the surface of the isolation material with a top surface of the substrate 101. The planarization step may be accomplished, for example, using a chemical mechanical polishing (CMP) process known and used in the art.

A well 102, where the source and drain of a transistor may be formed within, may be formed between two STIs 109. There is only one well 102 shown for one transistor 100 in FIG. 1, while there may be many wells for many transistors in an actual device. In an embodiment, the well 102 may be a p-type well to host the source and drain of a NMOS transistor 100. Alternatively, the well 102 may be an n-type well to host the source and drain of a PMOS transistor 100. In an embodiment, a high temperature thermal procedure may be performed, such as an annealing procedure, to drive and to activate the dopants in the p-type well or the n-type well 102. For example, in an embodiment, the well 102 may be formed by implanting p-type ions, such as boron ions, at a dose of about 1E12 to about 1E14 atoms/cm$^2$ and at an energy of about 20 KeV to about 500 KeV. In an embodiment, the well may have a depth of about 10,000 Å to about 30,000 Å and a width of about 3,000 Å to about 10,000 Å. Other embodiments may utilize different depths, widths, and/or doping parameters.

Two terminals 103 of the transistor 100, which are the source and the drain of the transistor 100, may be formed within the well 102. The transistor 100 may be a NMOS transistor or a PMOS transistor. The region 104 between the two terminals 103 is the channel for the transistor 100. A recess for a terminal 103 may be first etched into the well 102. The etching of the recess may be performed by a dry plasma etching process. In an embodiment, where the substrate 101 is a silicon substrate, the plasma etching process may employ fluorine chemistry. After forming the recess in the well 102, selective epitaxy may be performed to form the terminal 103. A terminal 103 may be either the source or the drain of the transistor 100. The epitaxially grown material for the terminal 103 may be a lattice-mismatched semiconductor material having a different lattice constant from that of the substrate 101 material. The lattice-mismatched material for the terminals 103 may be referred as a strained silicon material.

In an embodiment, the transistor 100 is a PMOS transistor and the lattice-mismatched material, or the strained silicon material for the terminals 103, may be silicon germanium with a composition $Si_{1-x}Ge_x$, where x may be within a range of about 0.1 to about 0.3. In another embodiment, the transistor 100 is an NMOS transistor and the lattice-mismatched material or the strained silicon material for the terminals 103 may be silicon carbon or silicon-germanium-carbon (Si1-x-yGexCy) where the mole fraction of carbon y is greater than a tenth of the mole fraction of germanium x. In an embodiment, the lattice-mismatched material such as silicon germanium may be grown by CVD using $Si_2H_6$ (disilane) and $GeH_4$ (germane) as source gases, with a substrate temperature of 600 to 900 degrees C., a $Si_2H_6$ partial pressure of 30 mPa, and a $GeH_4$ partial pressure of 60 mPa. There may be other ways to grow the silicon germanium or any other strained silicon material for the terminals 103.

The strained silicon material for the terminals 103 is a form of silicon in which a tensile strain is applied to the silicon lattice as a result of the difference in the dimensionalities of the strained silicon lattice and the lattice of the underlying silicon material on which it is formed. In an embodiment, the silicon germanium lattice for the terminals 103 is more widely spaced than a pure silicon lattice for the substrate 101, with the spacing becoming wider as the percentage of germanium increases. Because the silicon lattice aligns with the larger silicon germanium lattice during formation, a tensile strain is formed to the silicon layer for the terminals 103 that the silicon atoms are pulled apart from one another. Consequently, carrier mobility is dramatically increased in strained silicon compared to relaxed silicon, providing a potential increase in mobility of 80% or more for electrons and 20% or more for holes across the channel.

A gate insulating layer 118 may be formed on the surface of the substrate 101. The gate insulating layer 118 may be grown by thermal oxidation, or may be deposited by CVD. In an embodiment, the gate insulating layer 118 may have a thickness of range between about 3 Å and about 50 Å. In an embodiment, a silicon oxide layer may be used as the gate insulating layer for a gate formed of polysilicon material. The gate insulating layer 118 may be another material such as an oxide-nitride-oxide (ONO). In an embodiment, the gate insulating layer 118 may be a high dielectric layer with a dielectric constant that is greater than about 10 and may have a dielectric constant that is from about 15 to about 25. The gate insulating layer 118 may be a material selected from the group consisting of hafnium oxide (HfO), hafnium silicon oxide (HfSiO), hafnium oxide nitride (HfON), and similar materials. In an alternative embodiment, the gate insulating layer 118 may be formed from a material having a relative permittivity greater than about 5. Examples of such materials include aluminum oxide, lanthanum oxide, zirconium oxide, or combinations thereof.

A gate electrode 117 may be formed over the gate insulating layer 118. The thickness of the gate electrode 117 may be in a range between about 500 Å and about 2000 Å. In an embodiment, the gate electrode 117 may comprise polysilicon. In an alternative embodiment, the gate electrode may comprise another material such as polycrystalline silicon germanium. Alternatively, the gate electrode 117 may be a metal gate instead of a polysilicon gate. In one embodiment, the metal gate electrode 117 may comprise hafnium, zirconium, titanium, tantalum, aluminum or an alloy or metal carbide thereof. Metal carbide may be hafnium carbide, zirconium carbide, titanium carbide, tantalum carbide, aluminum carbide or the like. In another embodiment, the metal gate electrode 117 may be formed of a conductive material, such as a metal silicide (e.g., titanium silicide, cobalt silicide, nickel silicide, tantalum silicide), a metal nitride (e.g., titanium nitride, tantalum nitride), doped poly-crystalline silicon or poly-crystalline silicon germanium, or any other conductive materials. Combinations of these materials can be used.

A lithography step may then be performed followed by an etching step using a photoresist mask as an etch mask to form a gate stack comprising the gate insulating layer 118 and the gate electrode 117 as shown in FIG. 1. The etching masks may comprise an antireflective coating (BARC) hard mask layer.

Gate barriers 115 may be formed on the sides of the gate electrode 117 and gate insulating layer 118. In an embodiment, the gate barriers 115 may be formed by CVD of a dielectric material, e.g., silicon oxide or silicon nitride, followed by an anisotropic etching of the dielectric material. In another embodiment, the gate barriers 115 may be a composite barrier comprising a dielectric liner and a barrier body. The dielectric liner may be formed by the deposition of a dielectric liner material, e.g., silicon oxide, and the barrier body material, e.g. silicon nitride, followed by an anisotropic etch using reactive ion etching. In another embodiment, the liner may be an oxide and the barrier body may be a nitride.

A first inter-layer dielectric (ILD) layer 111 may be formed over the substrate 101. The gate stack of the gate insulating layer 118, the gate electrode 117, and the gate barrier 115 may be contained within the first ILD layer 111. The first ILD layer 111 may comprise a low dielectric constant (k value less than about 3.0) or an extreme low dielectric constant (k value less than about 2.5). For example, the first ILD layer 111 may comprise an oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS), as examples. A planarization process, such as a CMP process, may be performed to planarize the first ILD layer 111.

A plurality of contacts 113 may be formed within the first ILD layer 111. The contacts 113 may be formed over the terminals 103, i.e., the source and the drain. Contacts 113 are connected to the terminals 103. Contacts 113 may be formed by, etching recesses from a top surface of the first ILD layer 111 to reach the terminals 103. A thin barrier layer (not shown) may be deposited over the sidewalls of the recesses, such as by CVD, atomic layer deposition (ALD), physical vapor deposition (PVD), thermal oxidation, or a combination thereof. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the recess to form the contacts 113. The conductive material may be formed by an electro-chemical plating process, CVD, ALD, PVD, a combination thereof, and/or the like. The conductive materials may be selected from the group comprising copper, tungsten, aluminum, silver, gold, a combination thereof, and/or the like. The contacts may be formed of a compound comprising a semiconductor material and a metal such as cobalt (Co) or nickel (Ni). Excess conductive material and barrier layer may be removed by, for example, CMP, thereby forming the contacts 113 in connection with the terminals 103.

A through via 121 may be formed between two STIs 109, within the first ILD layer and into the substrate. The through via 121 may be a through silicon via, a through-substrate via, or some other kinds of through via. The through via 121 may be formed by etching an opening from a top surface of the first ILD layer 111 into the substrate 101. The depth of the opening may be in a range of about 10 um~300 um and the width of through via 121 may be in a range of about 1 um~30 um. A liner 105 may be formed over the first ILD layer 111 and the substrate 101 in the opening, covering the sidewalls and bottom of the opening. The liner 105 may be either TEOS or silicon nitride, or any suitable dielectric materials. The liner 105 may be formed using a plasma enhanced chemical vapor deposition (PECVD) process, or other methods such as PVD or a thermal process. A thin barrier layer 107 may be deposited over the liner 105, using methods such as by CVD, ALD, PVD, thermal oxidation, or a combination thereof. The barrier layer 107 may comprise a nitride or an oxynitride, such as titanium nitride, titanium oxynitride, tantalum nitride, tantalum oxynitride, tungsten nitride, or a combination thereof.

A conductive material may be deposited in the opening over the thin barrier layer 107 to form the through via 121. The conductive material may be formed by an electro-chemical plating process, CVD, ALD, PVD, or a combination thereof. The conductive material may be selected from a group consisting copper, tungsten, aluminum, silver, gold, a combination thereof, and/or the like. Excess conductive material and barrier layer may be removed by, for example, CMP, thereby forming the through via 121 as illustrated in FIG. 1.

The through via 121 may be used to connect two dies on top of each other. The through via 121 may be either electrically connected to an electrical device, e.g., such as the transistor 100, or may be electrically coupled to an external electrical connection on the front side of the substrate 101. The through via 121 may act as a pass-through via, allowing devices coupled to the front side of the substrate 101 to electrically communicate to devices coupled to the backside of the substrate 101, or to communicate with devices of a different die.

A contact etch stop layer (CESL) 119 may be formed over the first ILD layer 111, the contacts 113, the gate electrode 117, and the through via 121, to act as a high stress layer. The CESL 119 may be blanket formed of silicon nitride, silicon carbide, silicon oxide, or any other high-stress material. The stress may be compressive or tensile in nature and may have a magnitude in the range of 0.1 to 4 giga-pascals (GPa). The CESL 119 may be formed by a CVD process. The CVD process can be a low-pressure CVD (LPCVD) process or a PECVD process, as commonly known and used in the art. The stress applied on the CESL generates tensile or compressive strain in the channel of the transistor 100 on the semiconductor substrate to improve the carrier mobility further.

Figure 2:
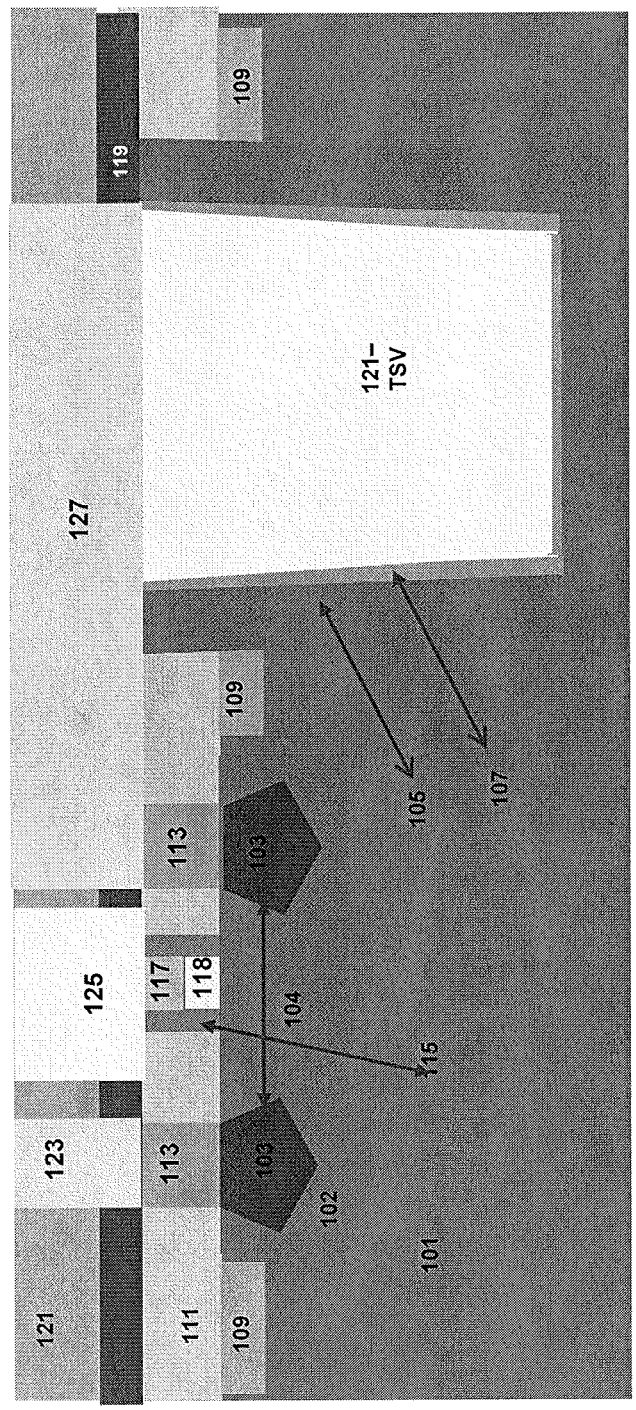

As illustrated in FIG. 2, a second inter-layer dielectric (ILD) layer 121 may be formed over the CESL 119. The second ILD layer 121 may comprise a low dielectric constant (k value less than about 3.0) or an extreme low dielectric constant (k value less than about 2.5). In an embodiment, the second ILD layer 121 may comprise an oxide, $SiO_2$, BPSG, TEOS, SOG, USG, FSG, HDP oxide, or PETEOS. A planarization process, such as a CMP process, may be performed to planarize the second ILD layer 121.

As illustrated in FIG. 2, contacts 123, 125, and 127 may be formed in the second ILD layer 121 and the CESL 119. Openings through the second ILD layer 121 and the CESL 119 may be formed by photolithography techniques by depositing and patterning a photoresist layer to expose a portion of the second ILD layer 121 and the CESL 119 corresponding to the desired position of the openings. Thereafter, the second ILD layer 121 and the CESL 119 may be etched using an anisotropic etching process. The contact 123, 125, and 127 may be formed with a conductive material selected from a group consisting copper, tungsten, aluminum, silver, gold, or a combination thereof. Excessive amounts of the conductive material may be removed from the top surface of the second ILD layer 121 using a planarization process, such as a CMP process.

In an embodiment, the contact 127 is formed over a contact 113 and the through via 121. The contact 127 connects the through via 121 with one contact 113 in the first ILD layer 111, which is further connected to a terminal 103 in the substrate 101. Therefore an electrical connection may be formed between the through via 121 and the terminal 103, going through the contact 127 in the CESL 119 and the second ILD layer 121, and the contact 113 in the first ILD layer 111. The terminal 103 may be the source or the drain of the transistor 100. The contact 125 is connected to the gate electrode 117. The contact 123 is connected to another terminal 103 of the transistor 100. The contact 125 and the contact 123 connect the transistor source or drain, and gate to other part of the circuit, while the contact 127 connects to the through via which may be further connected to devices of other die.

Figure 3:
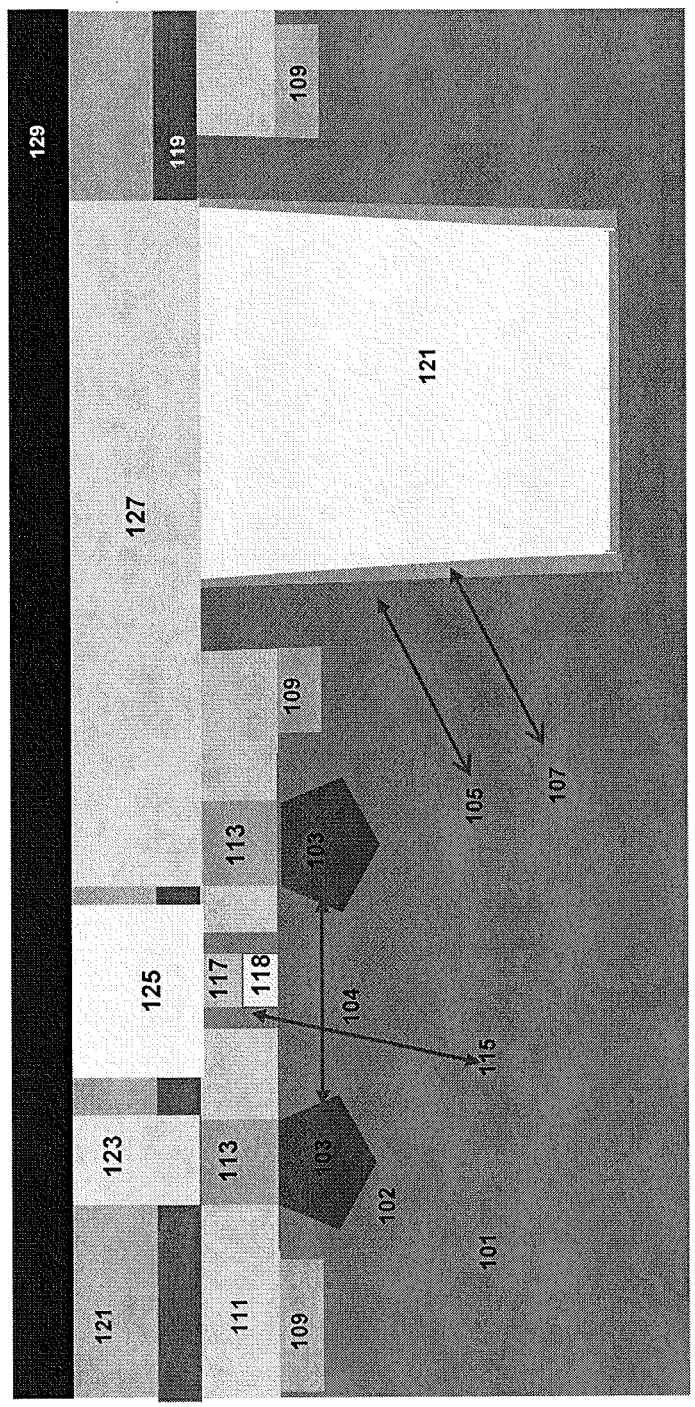

As illustrated in FIG. 3, an etching stop layer (ESL) 129 may be formed over the second ILD layer 121, covering the contacts 123, 125, and 127. The ESL 129 may be formed by a thin film growing technique. The ESL 129 may be made of an oxide material, a nitride material or a carbon-based diamond material. The ESL 129 may be formed by a CVD process. The CVD process can be a LPCVD process or a PECVD process, as commonly known and used in the art.

Figure 4:
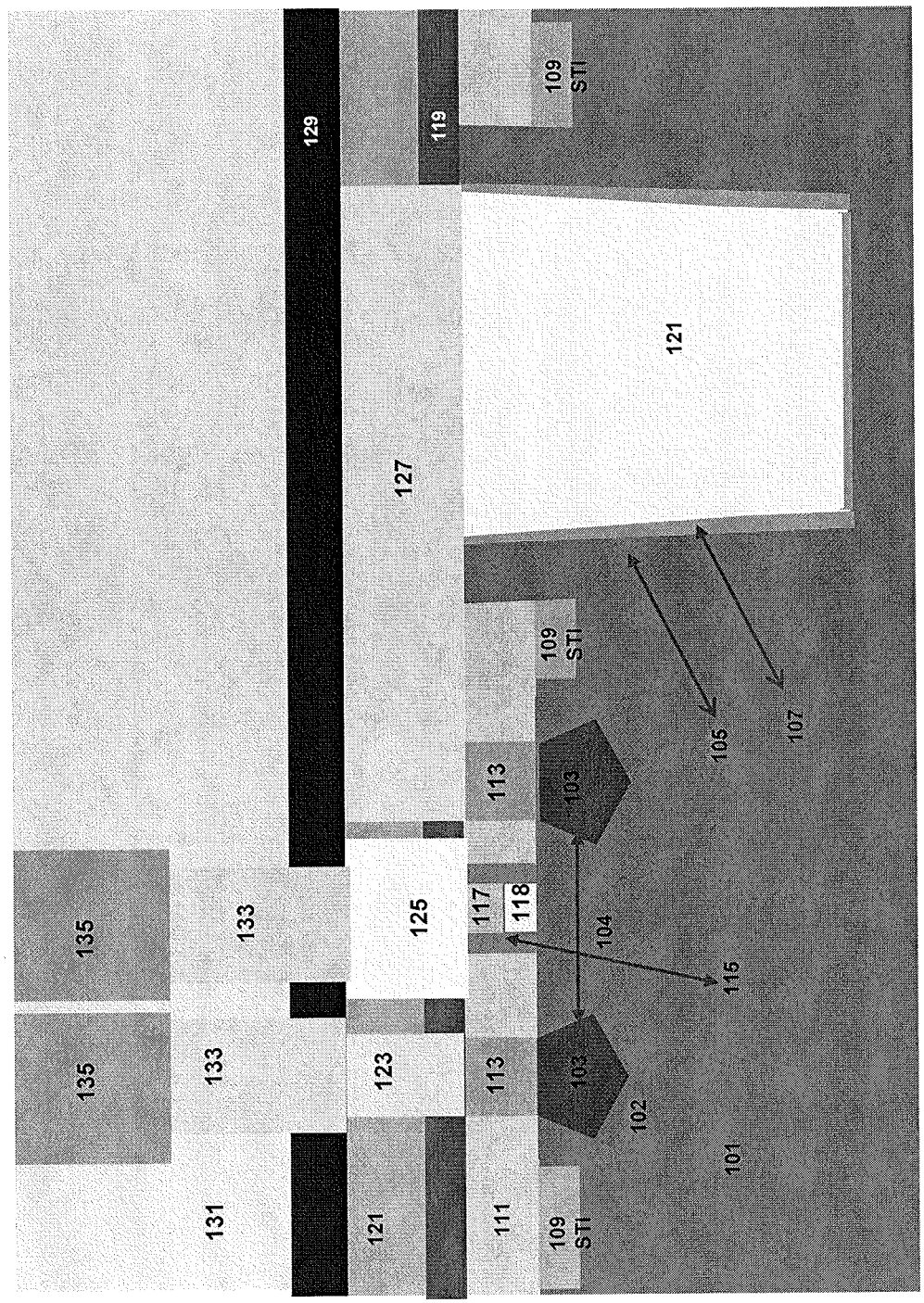

As illustrated in FIG. 4, a first metal layer $M_1$ may be formed over the ESL 129. The first metal layer $M_1$ may comprise a layer of conductive wiring comprising conductive lines 135 and vias 133. The conductive lines 135 and vias 133 are formed in an inter-metal dielectric (IMD) layer 131 which is over the ESL 129. The conductive lines 135 may be formed of any conductive material selected from a group consisting copper, tungsten, aluminum, silver, gold, a combination thereof, and/or the like. The IMD layer 131 may comprise a low dielectric constant or an extreme low dielectric constant (ELK) material, such as an oxide, $SiO_2$, BPSG, TEOS, SOG, USG, FSG, HDP oxide, or PETEOS. A planarization process, such as a CMP process, may be performed to planarize the IMD layer 131. The conductive lines 135 and vias 133 may be formed, e.g., using a plating and etching process or through a damascene or dual-damascene process, in which openings are etched into the corresponding dielectric layer and the openings are filled with a conductive material.

Figure 5:
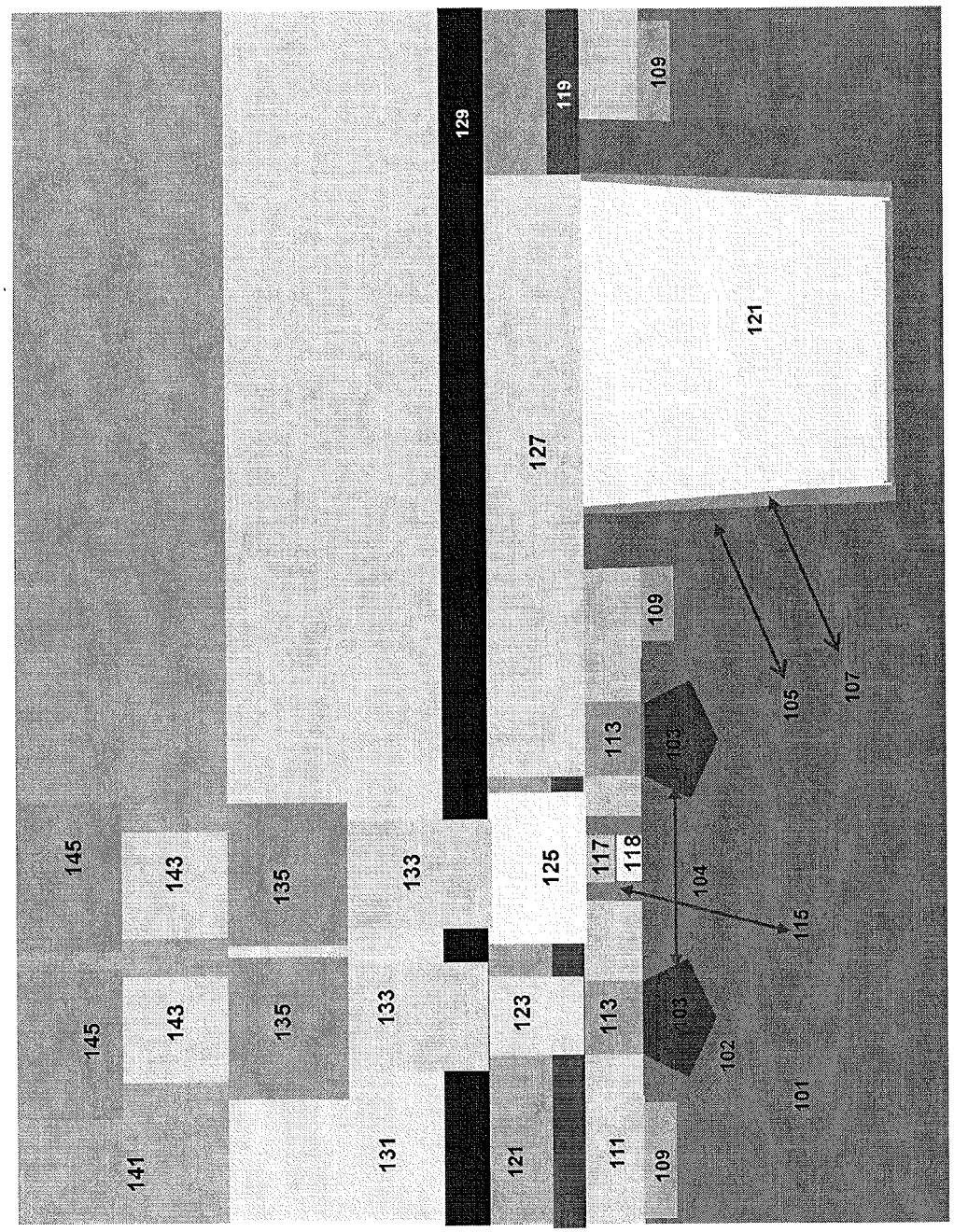

As illustrated in FIG. 5, a second metal layer $M_2$ may be formed over the first metal layer $M_1$. The second metal layer $M_2$ may comprise a layer of conductive wiring comprising conductive lines 145 and vias 143. The conductive lines 145 and vias 143 are formed in an IMD layer 141 which is over the IMD layer 131. The conductive lines 145 may be formed of any conductive material selected from a group consisting copper, tungsten, aluminum, silver, gold, a combination thereof, and/or the like. The IMD layer 141 may comprise a low dielectric constant or an extreme low dielectric constant (ELK) material, such as an oxide, $SiO_2$, BPSG, TEOS, SOG, USG, FSG, HDP oxide, or PETEOS. A planarization process, such as a CMP process, may be performed to planarize the IMD layer 141. The conductive lines 145 and vias 143 may be formed, e.g., using a plating and etching process or through a damascene or dual-damascene process, in which openings are etched into the corresponding dielectric layer and the openings are filled with a conductive material.

Generally, more metallization layers $M_3$-$M_n$ comprising conductive lines and vias to electrically couple individual devices may further be formed over the second metal layer $M_2$. The layers of conductive lines and vias may be formed in layers of IMD layers. In an embodiment the metallization layers $M_3$-$M_n$ may be formed of copper, although other materials, such as tungsten, aluminum, gold, or the like, could alternatively be utilized. On top of the metallization layers, a passivation layer having external contacts may be formed. The external contacts may include an under-bump metallization (UBM) structure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
 a terminal of a transistor formed of a strained silicon material and formed within a substrate;
 a first contact over the terminal and connected to the terminal, formed within a first inter-layer dielectric (ILD) layer over the substrate;
 a through via extending through the first ILD layer into the substrate; and
 a second contact over the first contact and the through via, connected to the first contact and the through via, and formed within a second ILD layer and a contact etch stop layer (CESL), wherein the second ILD layer is over the CESL, and the CESL is over the first ILD layer.

2. The device of claim 1, further comprising:
 a gate of the transistor formed within the first ILD layer;
 a third contact over the gate and connected to the gate, formed within the second ILD layer and the CESL;
 a via over the third contact and connected to the third contact; and
 a metal contact of a first metal layer over the via and connected to the via.

3. The device of claim 2, further comprising:
 an etching stop layer (ESL) over the second ILD layer and a first inter-metal dielectric (IMD) layer over the ESL, wherein the via goes through the ESL and the first IMD layer in contact with the third contact.

4. The device of claim 1, wherein the transistor is a NMOS transistor or a PMOS transistor.

5. The device of claim 1, wherein the terminal is a source or a drain of the transistor.

6. The device of claim 1, wherein the substrate comprises a material selected from a group consisting essentially of a doped bulk silicon substrate, an undoped bulk silicon substrate, a semiconductor-on-insulator (SOI) substrate, a compound semiconductor substrate, or an alloy semiconductor substrate.

7. The device of claim 1, wherein the strained silicon material comprises a silicon germanium, or a silicon-germanium-carbon.

8. The device of claim 1, wherein the through via comprises a conductive material selected from a group consisting essentially of copper, tungsten, aluminum, silver, gold, or a combination thereof.

9. The device of claim 1, wherein the through via comprises a liner and a barrier layer around the through via extending through the first ILD layer into the substrate.

10. The device of claim 1, wherein the first ILD layer and the second ILD layer comprise a material selected from a group consisting essentially of an oxide, $SiO_2$, borophosphosilicate glass (BPSG), tetraethylorthosilicate (TEOS), spin-on glass (SOG), undoped silicate glass (USG), fluorinated silicate glass (FSG), high-density plasma (HDP) oxide, or plasma-enhanced TEOS (PETEOS).

11. The device of claim 1, wherein the first contact and the second contact comprise a conductive material selected from a group consisting essentially of copper, tungsten, aluminum, silver, gold, or a combination thereof.

12. The device of claim 1, wherein the CESL comprises a material selected from a group consisting essentially of silicon nitride, silicon carbide, silicon oxide, or other high-stress material.

13. The device of claim 2, wherein the gate comprises a gate insulating layer and a gate electrode.

14. The device of claim 13, wherein the gate electrode is a metal gate electrode comprises a material selected from a group consisting essentially of hafnium, zirconium, titanium, tantalum, aluminum, a metal carbide, a metal silicide, a metal nitride, or a combination thereof.

15. A method of manufacturing a device, comprising:
 forming a terminal of a transistor within a substrate using a strained silicon material;
 forming a first inter-layer dielectric (ILD) layer over the substrate;
 forming a first contact within the first ILD layer, wherein the first contact is over the terminal and connected to the terminal;
 forming a through via extending through the first ILD layer into the substrate;
 forming a contact etch stop layer (CESL) over the first ILD layer;
 forming a second ILD layer over the CESL; and
 forming a second contact within the second ILD layer and the CESL, wherein the second contact is over the first contact and the through via and connected to the first contact and the through via.

16. The method of claim 15, further comprising:
forming a gate of the transistor within the first ILD layer;
forming a third contact within the second ILD layer and the CESL, wherein the third contact is over the gate and connected to the gate;
forming a via over the third contact and connected to the third contact; and
forming a metal contact of a first metal layer over the via and connected to the via.

17. The method of claim 16, further comprising:
forming an etching stop layer (ESL) over the second ILD layer;
forming a first inter-metal dielectric (IMD) layer over the ESL; wherein the via goes through the ESL and the first IMD layer in contact with the third contact.

18. The method of claim 15, wherein the transistor is a NMOS transistor or a PMOS transistor, and the terminal is a source or a drain of the transistor.

19. The method of claim 15, wherein the strained silicon material comprises a silicon germanium, or a silicon-germanium-carbon.

20. A device comprising:
a terminal of a transistor formed of a strained silicon material and formed within a substrate;
a first contact over the terminal and connected to the terminal, formed within a first inter-layer dielectric (ILD) layer over the substrate;
a gate of the transistor formed within the first ILD layer;
a through via extending through the first ILD layer into the substrate;
a second contact over the first contact and the through via, connected to the first contact and the through via, and formed within a second ILD layer and a contact etch stop layer (CESL), wherein the second ILD layer is over the CESL, and the CESL is over the first ILD layer;
a third contact over the gate and connected to the gate, formed within the second ILD layer and the CESL;
a via over the third contact and connected to the third contact; and
a metal contact of a first metal layer over the via and connected to the via.

* * * * *